United States Patent [19]

Yu et al.

[11] 3,821,657

[45] June 28, 1974

[54] HIGH FREQUENCY SEMICONDUCTOR AMPLIFYING DEVICES AND CIRCUITS THEREFOR

[75] Inventors: Se Puan Yu; Wirojana Tantraporn, both of Schenectady, N.Y.

[73] Assignee: General Electric Company, Schenectady, N.Y.

[22] Filed: Oct. 25, 1972

[21] Appl. No.: 300,481

[52] U.S. Cl. ..... 330/39, 317/235 AM, 317/235 AN, 330/38 M

[51] Int. Cl. .......... H03f 3/14

[58] Field of Search .......... 330/38 R, 38 M, 39; 317/235 AM, 235 AN

[56] References Cited

UNITED STATES PATENTS

| | | | |
|---|---|---|---|
| 3,377,527 | 4/1968 | Beale et al. | 317/235 AM |
| 3,383,571 | 5/1968 | Turner et al. | 317/235 AN |
| 3,544,855 | 12/1970 | Nannichi | 331/107 UX |

*Primary Examiner*—Herman Karl Saalbach
*Assistant Examiner*—James B. Mullins
*Attorney, Agent, or Firm*—Julius J. Zaskalicky; Joseph T. Cohen; Jerome C. Squillaro

[57] ABSTRACT

A three terminal semiconductor device for providing power amplification at microwave frequencies includes emitter, base and collector regions. The collector region includes a drift zone for majority carriers generated therein adjacent the collector P-N junction by avalanche multiplication. The operating bias voltage of the collector region in relation to the base region is set so that the collector region is depleted of majority carriers and electric field intensity is produced adjacent the collector P-N junction which is less than that required to produce avalanche multiplication of conduction carriers over the collector region and current flow therein without limit. Signal current applied in circuit between the emitter and base regions produces a flow of majority conduction carriers into the collector region where they are multiplied by avalanche multiplication action. The avalanche generated charge acted upon by the electric field produced by the operating bias voltage is caused to traverse the drift zone and deliver power to an external load in circuit with the collector P-N junction. For avalanche multiplication to occur in the collector region in the preferred mode of operation of the device the semiconductor material thereof must be a material in which the avalanche coefficient of majority carriers therein is substantially greater than the avalanche coefficient of minority carriers therein.

18 Claims, 11 Drawing Figures

HIGH FREQUENCY SEMICONDUCTOR AMPLIFYING DEVICES AND CIRCUITS THEREFOR

The present invention relates in general to three terminal or two port semiconductor amplifying devices and circuits therefor and more particularly relates to such devices for providing power amplification at microwave frequencies.

Two port microwave power amplifying semiconductor devices for frequencies above those served by transistors, that is, above about four gigahertz are not available in the art. Impact-avalanche transit-time diodes, referred to in the art as IMPATT diodes, and transferred electron devices, referred to in the art as TED devices, have been used in reflection type amplifiers with isolation of input and output circuits being provided by circulator elements. The gain and stability of such reflection amplifiers utilizing two terminal or single port devices are very sensitive to operating conditions. Circuit designs which are stable for small signal levels result in amplifiers with low gain at high signal levels.

Accordingly, an object of the present invention is to provide a three terminal or two port semiconductor amplifying device which provides stable high level signal amplification at microwave frequencies.

Another object of the present invention is to provide a three terminal semiconductor amplifying device which has the simplicity in circuit requirements of a microwave transistor yet which operates at frequencies comparable to the frequencies of operation of IMPATT diodes functioning as oscillators at the same output power levels.

A further object of the present invention is to provide a three terminal semiconductor amplifying device which has the simplicity in circuit requirements of a microwave transistor yet which provides output power levels comparable to the output power levels of IMPATT diodes functioning as oscillators at the same frequency.

In carrying out the invention in one illustrative embodiment thereof there is provided a body of semiconductor material including an emitter region of one conductivity type, a base region of opposite conductivity type contiguous with the emitter region and forming an emitter P-N junction therewith, and a collector region of one conductivity type contiguous with the base region of opposite conductivity type forming a collector P-N junction therewith. The collector region of the device is constituted of semiconductor material in which the avalanche coefficient of majority conduction carriers therein is substantially greater than the avalanche coefficient of minority conduction carriers therein. Emitter, base and collector electrodes are connected respectively to the emitter, base and collector regions. The collector region is provided with a length between the collector P-N junction and the collector electrode which is substantially equal to one-half of the saturation drift velocity of majority carriers therein divided by the center frequency of the band of frequencies of operation of the device. The collector region includes an avalanche zone contiguous to the collector P-N junction and a drift zone including the remainder of the collector region. The length of the avalanche zone is substantially smaller than the length of the drift zone. The average net activator concentration in the collector region is such that when the collector is depleted of mobile charge carriers therein by application of a voltage of appropriate polarity and magnitude between the base electrode and the collector electrode an electric field is established in the collector region extending from the collector P-N junction to the collector electrode with the electric field intensity being greatest in the avalanche zone. The net activator concentration in the collector region and the length of the collector region are such that the electric field intensity in the avalanche zone is less than would produce avalanche multiplication of conduction carriers in the collector region and current flow therein without limit.

The novel features which are believed to be characteristic of the present invention ae set forth with particularity in the appended claims. The invention itself, both as to its organization and method of operation, together with further objects and advantages thereof may best be understood with reference to the following description taken in connection with the accompanying drawings wherein:

Figure 1:
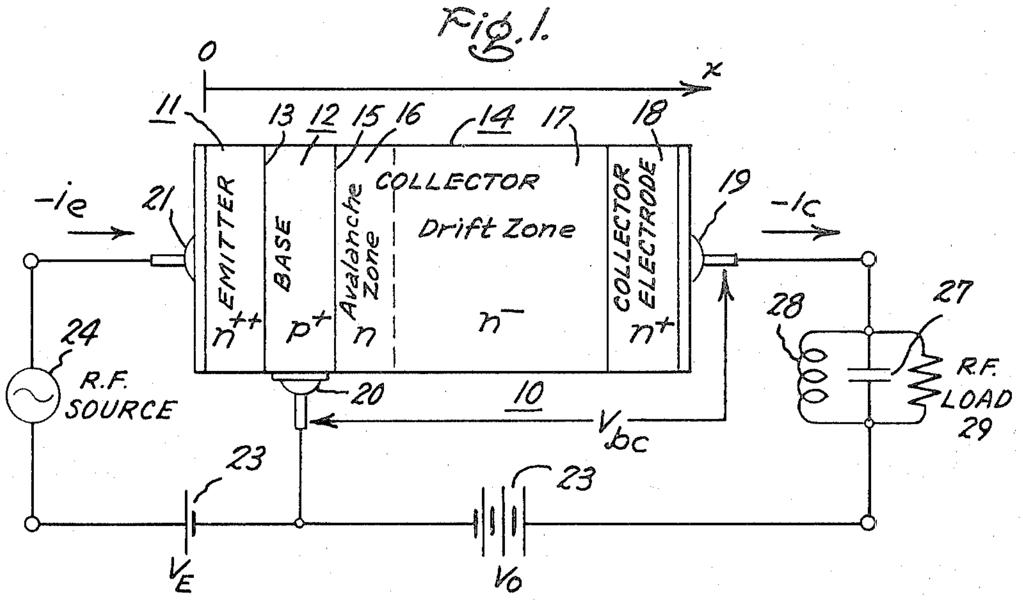
FIG. 1 shows a schematic diagram of a semiconductor device operatively connected in circuit in accordance with the present invention.
Figure 2:
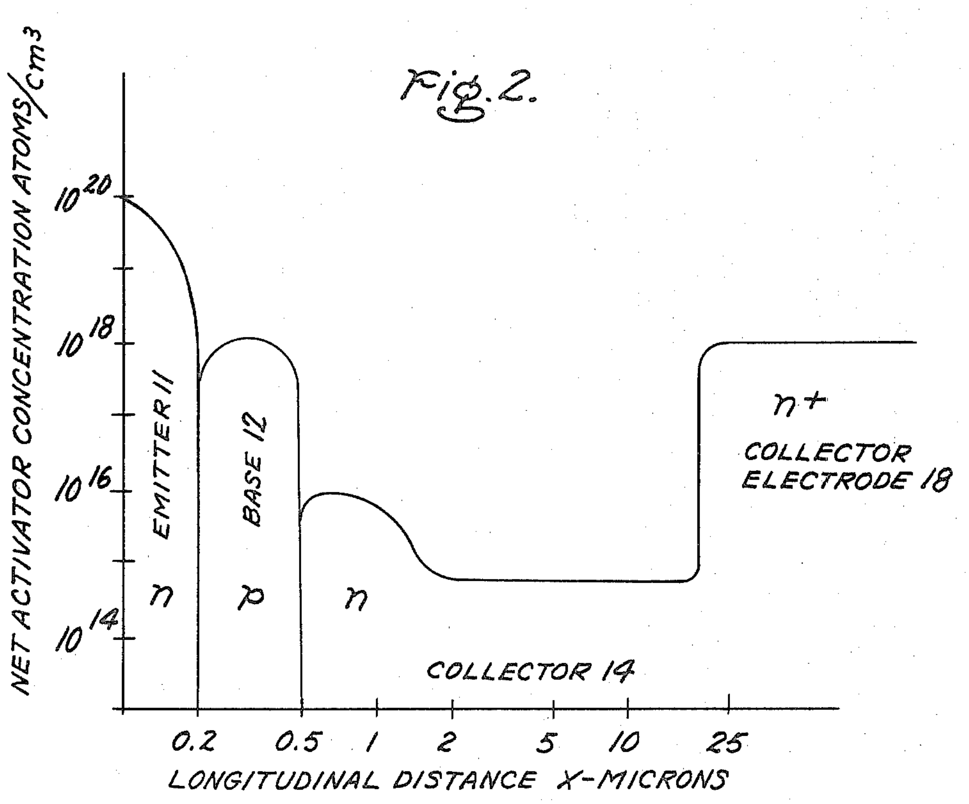
FIG. 2 shows a graph of a net activator concentration profile of the semiconductor device of FIG. 1 in which net activator concentration is set forth on a logarithmic scale along the ordinate of the graph and distance along the longitudinal axis of the device is set forth on a logarithmic scale along the abscissa of the graph.

Referring now to FIG. 1 there is shown a one dimensional schematic diagram of a semiconductor amplifying device 10 in accordance with the present invention. The device 10 includes a body of semiconductor material having a first or emitter region 11 of very strongly N-type conductivity, a second or base region 12 of strongly P-type conductivity contiguous with the base region to form an emitter P-N junction 13 therewith. The device 10 also includes a third or collector region 14 of N-type conductivity contiguous with the base region 12 to form a collector P-N junction 15 therewith. The body of semiconductor material is constituted of silicon in which the avalanche coefficient for electrons ($\alpha_n$) is substantially greater than the avalanche coefficient for holes ($\alpha_p$) for a wide range of electric field intensities over which avalanche multiplication of conduction carriers occurs therein. The concentration of net activators or impurities in each of the regions of the device 10 is shown in FIG. 2 as a function of distance $\chi$ through the first, second and third regions. The values of the net activator concentration in the emitter and base regions of the device are values that are conventionally used in microwave transistors, that is, the emitter region has a concentration substantially higher than the concentration in the base region to provide good minority carrier injection into the base region and of course the base region is thin to provide good transport of injected carriers to the collector P-N junction at the high frequency of operation.

The collector region 14 includes a narrow zone 16 contiguous to the collector P-N junction 15 and is referred to as the avalanche zone. The collector region 14 also includes a zone 17, referred to as the drift zone, which is substantially longer than the avalanche zone 16. The peak net activator concentration in the avalanche zone 16 is about two orders of magnitude less than the peak net activator concentration in the base region 12. The peak net activator concentration in the drift zone 17 is about two orders of magnitude less than the net activator concentration in the avalanche zone 16. The drift zone 17 is contacted by a region 18 of N-type semiconductor of high net activator concentration which is utilized as the substrate on which the device is formed and which also functions as a collector electrode to provide good ohmic connection to the drift zone. The net activator concentration in the region 18 may be several orders of magnitude greater than the net activator concentration in the drift zone 17 and of the same conductivity type. Conductive terminal 19 provides good low resistance connection to region 18. Similar conductive terminals 20 and 21 provide good low resistance conductive connection to base region 11 and to the emitter region 12, respectively.

The net activator concentration along the length of the collector region 14 is set so that when operating voltage Vo applied between the collector and base regions from source 25 reversely biases the collector P-N junction 15, the collector region 14 is depleted of mobile charge carriers. Under this condition an electric field is established in the collector region which is of maximum intensity at the collector P-N junction, drops sharply in the avalanche zone and thereafter drops at a substantially linear rate with distance in the drift zone, as the drift zone has a uniform net activator concentration along the length thereof, and to substantially zero at the interface between the drift zone and the region 18. Of course, as the reverse voltage applied across the collector P-N junction 15 is increased beyond the value at which the collector region is just depleted of majority carriers, depletion of majority carriers will occur in the substrate 18 and an electric field will exist therein. In the base region the electric field from a maximum value at the collector P-N junction decreases to zero. The average net activator concentration in the collector region and the net activator concentration in the avalanche zone in relation to net activator concentration in the drift zone is set so that when the collector region is depleted of mobile carriers, the electric field intensity in the avalanche zone causes charge injected thereinto to multiply by a finite factor as will be explained more particularly below. The length of the collector region between the collector P-N junction 15 and the third or collector electrode 18 is set to be substantially equal to one-half of the saturation drift velocity of majority carriers therein divided by the center frequency in the band of frequencies of operation of the device for reasons which will be readily understood from the consideration below of the operation of the device in circuit.

A source 23 of bias voltage $V_e$ and a source 24 of r-f or microwave signals to be amplified are connected in series between the base electrode 20 and the emitter electrode 21. The source 23 is shown as reversely biasing the emitter P-N junction 13 so that the device 10 would operate as a class C amplifier, i.e., an amplifier in which current from the *r-f* source 24 in the emitter-base circuit flows for less than 180° of an *r-f* cycle, as will be explained in connection with FIGS. 7 and 8. While preferable, the device 10 is not limited to class C operation. A capacitor 27, an inductor 28 and a load resistor 29 are all connected in parallel between the positive terminal of the source 23 and the collector electrode 19. Functionally the capacitor 27 includes the capacitance of the device 10 between the collector electrode 19 and the base electrode 20. The parallel resonant frequency of the combination is set to be substantially equal to the center frequency of the band of frequencies for which the device 10 is designed to operate.

Figure 3:
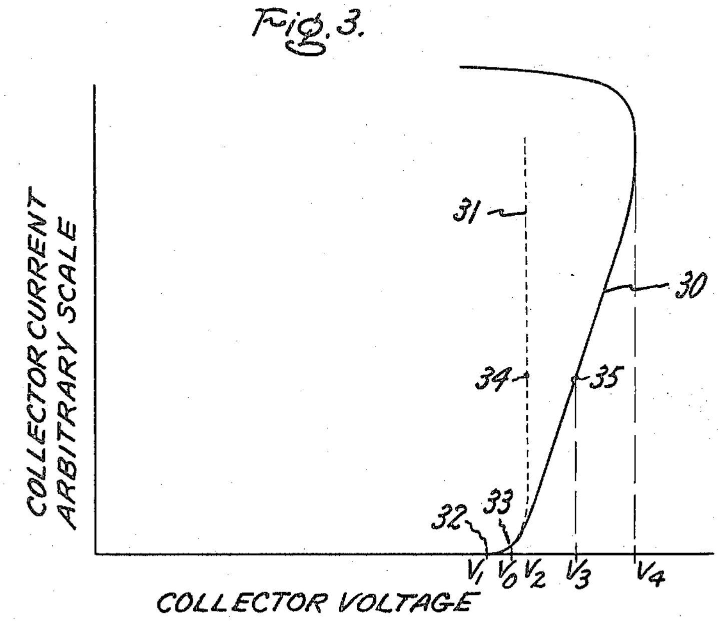
FIG. 3 shows a graph of current flow versus the voltage applied between the base and collector electrodes of the device of FIG. 1 useful in explaining the operation of the device to provide high power application at microwave frequencies.

Reference is now made to FIG. 3 which shows a graph 30 of the dc current versus dc voltage of the reversely biased base-collector structure of device 10 considered alone. Also shown in FIG. 3 is the graph 31 representing a hypothetical dc current versus dc voltage characteristic of the same structure for use in conjunction with the graph 37 of FIG. 4 for obtaining an understanding of the underlying theory of operation. The graph 37 represents the multiplication factor for charge entering the same base-collector structure of device 10 plotted versus the dc voltage in a hypothetical case in which the electric field profile and the avalanche coefficients are independent of the level of multiplication. The points 36, 38 correspond to the voltages $V_1$ and $V_o$, respectively. At voltage $V_2$ the graph 37 has a vertical slope and the multiplication factor increases to infinity. The graph 31 also has a vertical slope at voltage $V_2$. In a real material, such as silicon used in the base collector structure of device 10, the collector current as shown in FIG. 3 is initially very small and begins to increase at point 32 corresponding to voltage $V_1$ and increases further at point 33 corresponding to voltage $V_o$. The multiplication factors at $V_1$ and $V_o$ are the multiplication factors due to the avalanche process and are substantially 10 and 100, respectively. However, in a real material, such as silicon, as the multiplication factor becomes large, i.e., of the order of $10^6$, the presence of the charge generated by the avalanche multiplication process itself causes the electric field near the P-N junction to decrease and simultaneously causes the electric field near the collector electrode to increase. Such changes in the spatial field distribution at the same voltage causes the field near the P-N junction to drop below that which is needed to maintain the multiplication factor required. Hence in order to obtain the same current as that at the point 34 on the hypothetical graph 31 in FIG. 3, the real structure requires a larger voltage as shown in graph 30 as the point 35. Thermal effects also add to the voltage increase requirement.

The graph 30 in FIG. 3 up to the voltage slightly less than $V_4$ is thus the dc stable current-voltage relationship in a structure such as the base collector structure of the device 10. The almost linear portion of graph 30 between $V_2$ and $V_4$ would correspond to a current density of $10^2$-$10^3$ amperes/cm². Still at larger current levels, for example, greater than $10^4$ amperes/cm², the graph 30 would have a vertical slope, i.e., at voltage $V_4$, and at still larger current levels would have a negative slope and the structure would normally irreversibly breakdown. At a bias level $V_3$ corresponding to the point 35 in FIG. 3, if the base and collector electrodes are connected to a suitable resonant circuit, the *r-f* voltage excursions may swing beyond the dc stable limit $V_4$ but only for a short period of time. The average current then will be slightly higher than that at the point 35 with the same bias voltage $V_3$. This corresponds to IMPATT oscillator operation of the structure. The multiplication factor in an IMPATT diode oscillator is greater than $10^5$. For reasons which will be apparent later, the P-N base-collector portion of the device 10 is biased at a voltage in the vicinity of $V_o$ in FIGS. 3 and 4, i.e., with a multiplication factor in the range of about 5 to about 50. With a tuned circuit connected in circuit with the base and collector electrodes of the device 10 and operating at the indicated collector bias the device is *r-f* stable, i.e., it will not self-oscillate. In addition, the device has extremely low stand-by d-c current and is capable of amplifying charge appearing in the collector region in response to a signal applied to the emitter electrode as will be made clear in onnection with FIGS. 7 and 8.

Figure 4:
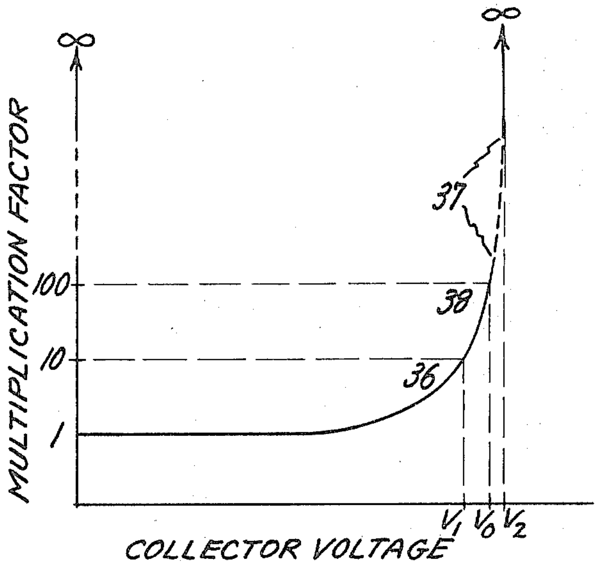
FIG. 4 shows a graph of multiplication factor for charge entering a hypothetical region of electric field intensity profile as a function of the voltage when only the avalanche process is considered and other physical effects neglected.

With the collector bias voltage $V_o$ applied between collector and base electrodes of the device, the d-c current flow through the device is stable, i.e., a given input current to collector region produces an output current which is related to the input current by a finite multiplication factor. At such bias the collector region satisfies the criterion for stability, namely that the feed back integral (F.B.I.) defined as $$\text{F.B.I.} \equiv 1 - \frac{1}{M} = \int_0^W \alpha^* dx \qquad (1)$$

where $\alpha^*$ is the effective avalanche coefficient, $d\Omega$ the thickness of a differential slab, and where the O to W limits are the span of distance over which electric field exists, M is the multiplication factor alluded to in connection with FIG. 4. Note that in equation 1, the multiplication factor is infinite when the F.B.I. is unity.

For an N-type semiconductor material where $\alpha_n$ and $\alpha_p$ are respectively the avalanche coefficients of electrons and holes, the effective avalanche coefficient $\alpha^*$ is defined as $$\alpha^* = \alpha_n \exp\left\{-\int_x^W (\alpha_n - \alpha_p) d\xi\right\} \qquad (2)$$

Note that $$\alpha^* \gtreqless \alpha_n$$

according as $$\alpha_p \gtreqless \alpha_n$$

where the signs apply correspondingly in the two expressions. Hence for a given electric field profile, the feedback integral is smaller and hence M is smaller if $\alpha_p < \alpha_n$ for an N-type collector region than if, for example, $\alpha_p = \alpha_n$. The case in which $\alpha_p < \alpha_n$ therefore can have larger range of voltage, from $V_1$ to $V_2$ in FIG. 4, with useful multiplication. Such larger dc stable multiplication range would render the semiconductor material less prone to electrical failure.

More importantly, the ratio of $\alpha^*$ to $\alpha_n$ at $x = o$, viz. exp $$\left\{-\int_0^W (\alpha_n - \alpha_p) d\xi\right\},$$

is related to the ratio of the apparent additional electrons injected at the base-collector P-N junction to the number of electrons actually injected. The apparent additional electrons are the result of the avalanche multiplication process of the holes arriving at the junction after the holes themselves were generated by the avalanche process within the collector region slightly earlier. If the additional electrons are larger in number than the electrons injected by the signal then the significance of the signal is reduced, i.e., the device would have a large output practically independent of the magnitude of the signal. In order to obtain large multiplication without loss of the signal significance, i.e., large dynamic range of amplification, $\alpha_p$ must be substantially smaller than $\alpha_n$, for the N-type semiconductor. Recapitulating, the condition $\alpha_n >> \alpha_p$ for N-type semiconductor (or $\alpha_p >> \alpha_n$ for P-type) is necessary for a larger dc stable range of voltage with moderate multiplication factor and for the larger dynamic range of signal amplification.

Figure 5:
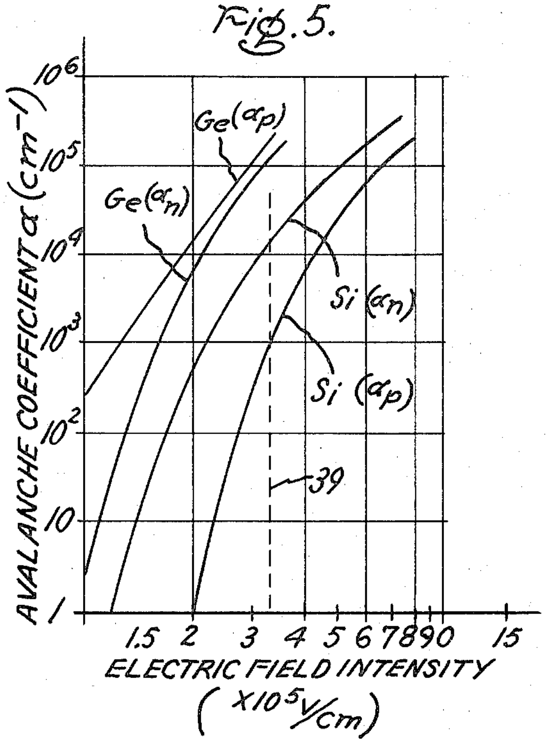
FIG. 5 shows graphs of the avalanche coefficients for electrons and holes in both silicon and germanium as a function of electric field intensity.

The semiconductor silicon fulfills the requirement for an N-type material, having $\alpha_n \approx 10\alpha_p$ in the range of electric field values of interest. For a P-type material germanium, with $\alpha_p > \alpha_n$, is also suitable. The materials with $\alpha_n \approx \alpha_p$ such a GaAs and GaP are not suitable for use in accordance with this invention. It is noted that in many materials the disparity between $\alpha_n$ and $\alpha_p$ is larger at lower electric field values, for example in germanium and in silicon as shown in FIG. 5. However, this fact cannot be taken advantage of to obtain a larger disparity by setting the operating voltage lower, as the multiplication factor would be too low and render the device useless. Silicon semiconductor material fulfills all the requirements regarding $\alpha_n$ and $\alpha_p$ disparity in the multiplication range of interest.

Reference is now made to FIG. 5 which shows the avalanche coefficient for both electrons and holes in both silicon and germanium as a function of electric field intensity. A typical value of electric field strength in the avalanche zone of FIG. 1 having the profile indicated in FIG. 2 which would provide a current multiplication of about 10 and a ratio of the avalanche coefficient of electrons to the avalanche coefficient of holes of about 10 is approximately $3.3 \times 10^5$ volts per cm represented by ordinate 39.

Figure 6:
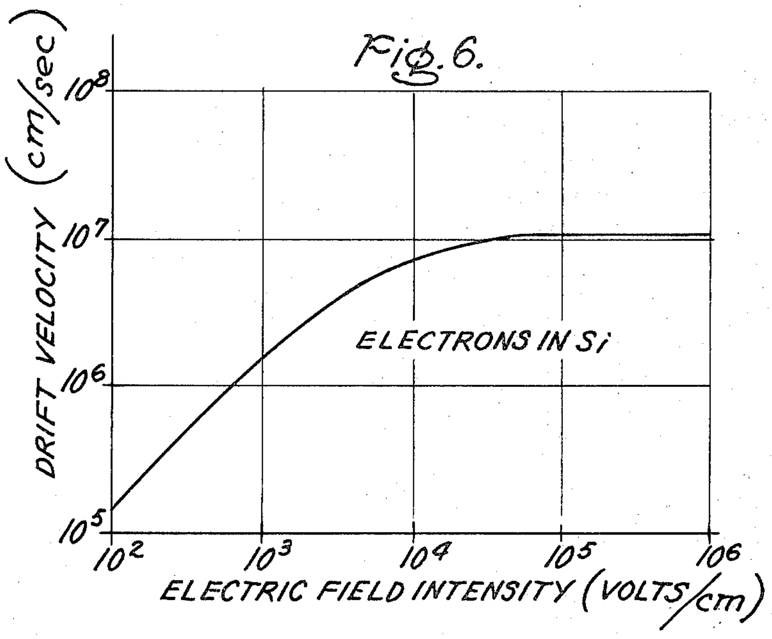
FIG. 6 shows a graph of drift velocity as a function of electric field intensity for electrons in silicon semiconductor material, which will be useful in explaining the operation of the device and circuit of FIG. 1.

Reference is now made to FIG. 6 which shows the drift velocity for electrons in silicon as a function of electric field intensity. At an electric field strength of about $10^4$ volts per cm the drift velocity of electrons is close to its saturation value of about $10^7$ cm per sec. This value of electric field strength is at least an order of magnitude less than the electric field strength of $3.3 \times 10^5$ volts per cm. in the avalanche zone at the bias point represented by ordinate 39 in FIG. 4. Accordingly, the multiplied charge carries in the avalanche zone initially move at saturation drift velocity and as the component of field strength produced by collector bias voltage decreases along the collector region the carriers might move at less than saturation drift velocity. However, under proper *r-f* operating conditions, the moving avalanche generated charge raises the electric field intensity in the region through which it is passing, synchronous with the voltage change, so that for all practical purposes the moving charge traverses the collector region at substantially saturation drift velocity. This is particularly true if the density of the avalanche generated charge is comparable to the net activator concentration, and when the time required for the charge to transverse the base-collector space is approximately one-half of the operating *r-f* period.

Figure 7:
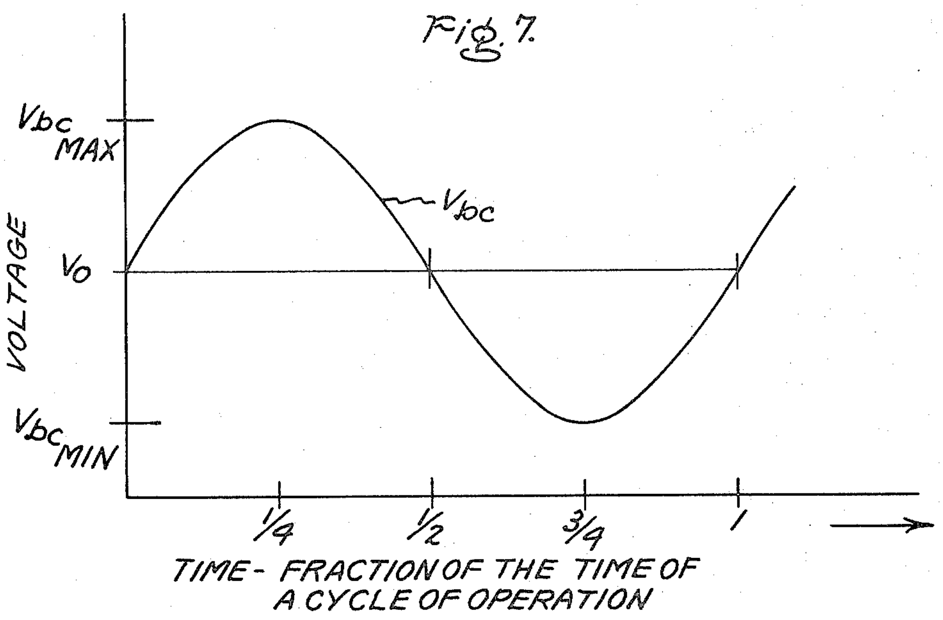
FIG. 7 shows graphs of the dc operating voltage and the ac voltage developed across a parallel resonant circuit including a resistive load as a function time, which will also be useful in explaining the operation of the device and circuit of FIG. 1.

Having set forth the structure of the semiconductor amplifying device 10 of FIG. 1 and having described the circuit connections thereto and also having described the movement and generation of charge carriers taking place in various parts of the semiconductor device, in response to bias conditions, the operation of the device and circuit of FIG. 1 will now be explained. The emitter-base circuit is biased by source 23 for class C amplifier operation, that is, signal charge is injected from the emitter region into the base region over less than one-half of each high frequency cycle of operation. Reference is now made to FIG. 7 which shows a graph of the cyclical voltage $V_{bc}$ between the base and collector electrodes of the device vs. time set forth in terms of fractions of a high frequency cycle operation of the device. The voltage $V_{bc}$ is the sum of the voltage $V_L$ across the load impedance and the dc operating voltage represented by ordinate $V_o$, constant with time, and corresponds to voltage $V_o$ of FIG. 3. The voltage $V_{bc}$ starting at time O is $V_o$, reaches a maximum $V_{bc}$ max. at the one-quarter cycle point and returns to $V_o$ at the one-half cycle point. The voltage $V_{bc}$ then drops to a minimum value $V_{bc}$ min. at the three quarter cycle point and returns to $V_o$ at the completion of the cycle.

Figure 8:
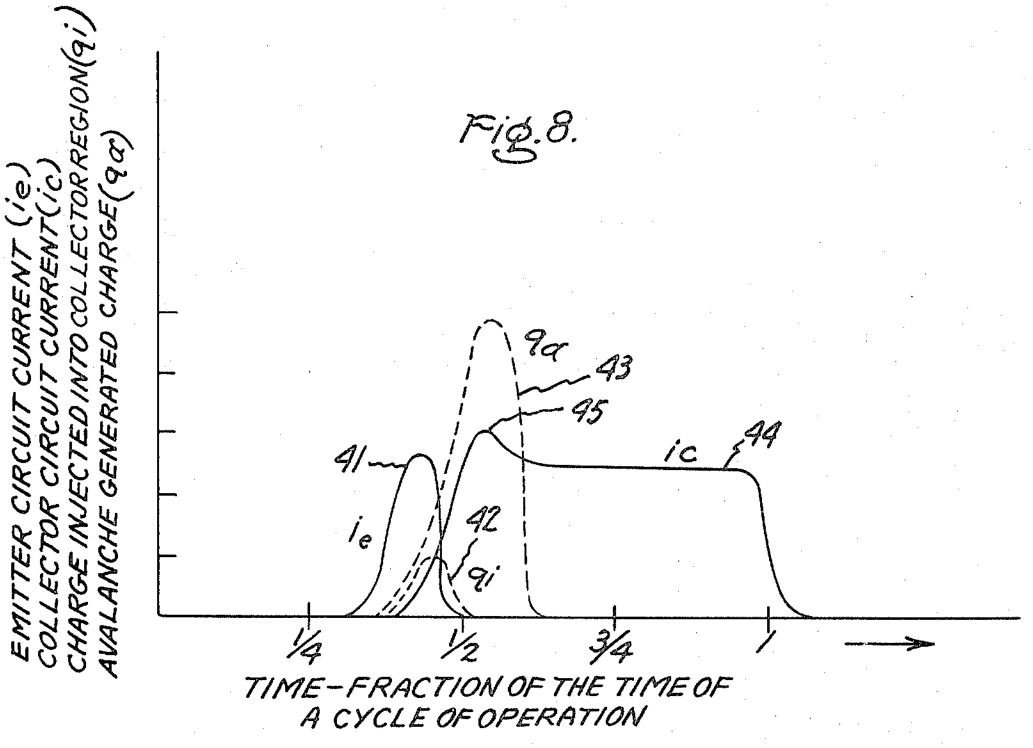
FIG. 8 shows graphs of current and electric charge in various portions of the device and circuit of FIG. 1 as a function of time which will be useful in conjunction with the graphs of FIG. 7 in explaining the operation of the device and circuit of FIG. 1 to provide power amplification at microwave frequencies.

Reference is also made to FIG. 8 which shows graphs of four operating parameters in the semiconductor device and circuit of FIG. 1 as a function of time also expressed in terms of fractions of a high frequency cycle of operation thereof. The graph 41 of emitter circuit current $i_e$, the graph 42 of charge injected into collector region $q_i$, the graph 43 of avalanche generated charge $q_a$, and the graph 44 of collector circuit current $i_c$, are plotted along the ordinate as a function of time. The ordinate scales for the charges are substantially the same, and differ from the scales for currents. As pointed out above, as the emitter-base region of the device is reversely biased so that no current is flowing except when the emitter base P-N junction is forward biased which occurs only during a portion of the negative excursion of the *r-f* cycle, the duration of emitter current flow $i_e$ is less than one-half of a cycle. The occurrence of the negative peak of *r-f* input signal is timed to occur at about the time that the voltage $V_{bc}$ of FIG. 7 is beginning its negative excursion below voltage level represented by $V_o$. This is one by the proper choice of the drift length in the collector region. The graph 41 of emitter current $i_e$ represents charge injected into the base region. All of the charge injected at the emitter P-N junction does not reach the collector P-N junction. A substantial portion of the injected charge is lost in transit at the base region at the high frequency of operation so that only a portion of the charge reaches the collector P-N junction. The charge that reaches the avalanche zone is represented by $q_i$. The peak of occurrence of $q_i$ is a small fraction of the high frequency cycle later than the peak of the occurrence of the emitter circuit current $i_e$. The delay of the peak of $q_i$ with respect to $i_e$ represents transit time delay of charge carriers in the base region. The amplitude is reduced representing loss of charge due to recombination and diffusion. The charge $q_i$ injected into the avalanche zone is multiplied and appears as charge multiplied by avalanche action in the avalanche zone. In the figure, the peak of graph 43 of the avalanche charge $q_a$ is shown to have an amplitude of approximately five times the amplitude of the injected charge $q_i$. The peak of $q_a$ occurs subsequent to the peak of the injected charge $q_i$.

Figure 10:
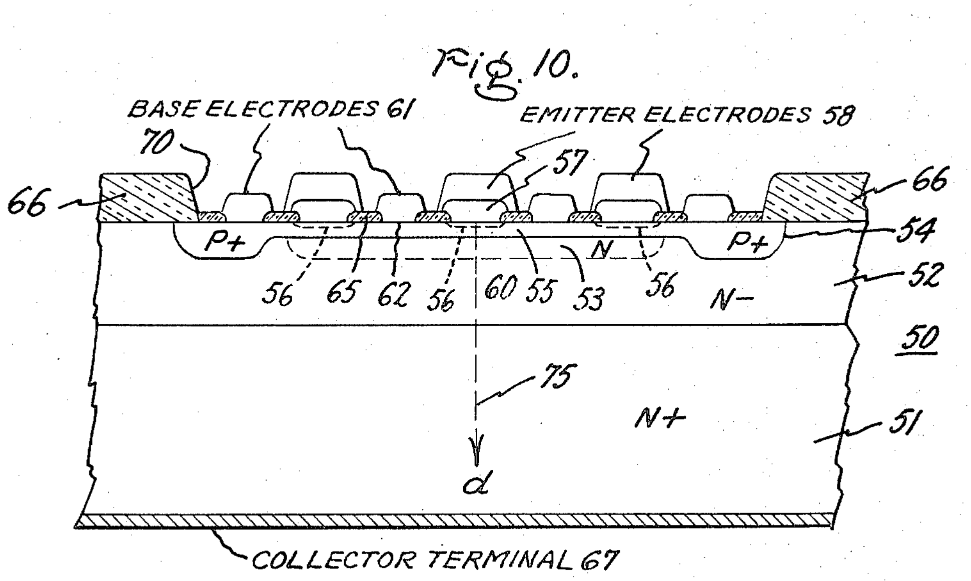
FIG. 10 is a sectional view of the device of FIG. 9 taken along section lines 10—10 showing the internal construction of the device of FIG. 9 and illustrating the manner of fabrication thereof.

The avalanche charge generated in the avalanche zone moves from avalanche zone and through the drift zone at substantially saturation velocity toward the collector electrode even during the voltage down swing as pointed out in connection with FIG. 6. As the charge moves in the drift zone, between the collector P-N junction and the collector electrode, it induces current flow in the external circuit connected between the base electrode and the collector electrode. As the charge is relatively constant in magnitude and moves at a relatively constant velocity, it induces a relatively constant current $i_c$ between the base and the collector electrodes represented by the graph 44. The peaking of collector current $i_c$ at the leading edge 45 thereof is produced by the hole component of current generated in the avalanche zone and collected at the collector P-N junction. The hole component of collector current is somewhat smaller in relation to the current produced by movement of avalanche generated electrons from collector P-N junction to collector electrode. The fundamental component of external current $i_c$ is about 180° out of phase with respect to the voltage appearing between the base and collector electrodes. Accordingly, power is developed in the collector region and delivered to the load. To provide a steep rise of collector current $i_c$ and hence provide good efficiency of operation, it is necessary that avalanche charge build up rapidly. Providing an avalanche zone of small longitudinal extent and having a substantially higher net activator concentration than the net activator concentration in the drift zone achieves such result. When such a collector region, constituted of silicon and meeting the requirement that the integral of the net activator concentration over the length thereof is equal to about 2.5 × $10^{12}$ $cm^{-2}$, is depleted of mobile charge carriers, a sufficiently high electric field intensity is produced at the base collector P-N junction and a small electric field intensity is produced at the collector electrode to provide the operation described above. The integral of net activator concentration in the collector region of the devices of FIGS. 1 and 10, depicted in FIGS. 2 and 11, respectively, meets the aforementioned requirement.

Under bias voltage $V_o$ in FIG. 7 the N-type collector region is depleted of carriers and a positive space charge is established such that the electric field intensity is high at the base-collector P-N junction and is near zero at the collector electrode. From an inspection of FIG. 7, it would appear that at time of three-fourths period point the field at the collector would be zero or that the field in part of the drift zone would be low and consequently the charge moving in the drift zone 14 would not travel at saturation drift velocity. This however is not the case under proper operating conditions. Since the spatial slope of the electric field profile is proportional to the space charge, the electrons created by the avalanche process cancel a portion of the positive space charge at the locality of the electrons and hence change the slope thereby. This results in the lowering of the field value at the P-N junction and raising the field value at the collector terminal if the voltage is held constant. Hence the voltage may be lowered somewhat without having the electric field vanish at any locality within the collector region. Thus the avalanche generated electrons drift through the collector drift zone under high field at the saturation velocity despite the fact that the voltage swings down in FIG. 7 during the drift time. The proper value of the avalanche generate charge is substantially the same as the net activator concentration in the drift zone. The considerations entering into determination of this proper value are the desire to achieve maximum voltage swing for high efficiency operation, and the opposing desire to limit avalanche multiplication so that output remains proportional to input signal as discussed earlier in connection with the avalanche coefficients.

Also, while it has been stated that it is essential for the drift zone to be depleted of majority carriers and the electric field extend to the collector electrode, the device and circuit would operate even though depletion does not extend to the collector electrode. The portion of the drift zone not depleted of majority carriers would not only represent a series impedance in the collector circuit and hence would represent a power loss in the device which would reduce the efficiency of the device, but also would change the preferred operating frequency of the device and would further reduce efficiency.

While there are many loss mechanisms in the emitter and base regions reducing efficiency of injection of carriers into the collector region, these do not limit the amplification capability of the device as a compensating mechanism is provided in accordance with the invention, that is, avalanche multiplication of charge injected into the avalanche zone. Accordingly, signal charge which is lost between emitter and collector regions because of various causes during transit can be more than regained by charge multiplication in the avalanche zone of the collector region. In addition, the avalanche multiplied charge is moved at high voltage in the high impedance collector region to provide further amplification in the device. The use of a relatively long drift zone in the collector region enables high voltages to be used with low standby current and hence good efficiency. In accordance with the desirability of assuring that collector region is depleted of majority carriers other than the avalanche generated charge, the operation is set so that the minimum voltage $V_{bc}$ min. does not drop below a certain small fraction of the operating voltage $V_o$ to provide a net electric field in the drift zone.

The parallel resonant circuit of FIG. 1 has been represented by the lumped capacitive element 27 and the lumped inductive element 28. The capacitive element 27 includes the device capacitance between the collector and base electrodes. Thus the use of a resonant circuit in the collector base circuit enables the device capacitance to be tuned out and, in addition, it enables the internal impedance of the device to be matched to the load impedance 29 to which power is to be delivered. While the parallel resonant circuit has been represented in lumped elements, it will be readily appreciated that distributed elements such as wave guides or transmission line sections may be utilized to provide this function.

While the invention has been described in connection with an embodiment in which an avalanche zone is provided having a substantially higher net activator concentration in the avalanche zone than in the drift zone of the collector region, a net activator concentration in the collector region which is substantially uniform will also work, provided the requirements mentioned above are met. Also, while the avalanche zone has been shown as narrow, such zone could be a substantial portion of the collector region, for example, of the order of one-half of the longitudinal extent of the collector region.

Figure 9:
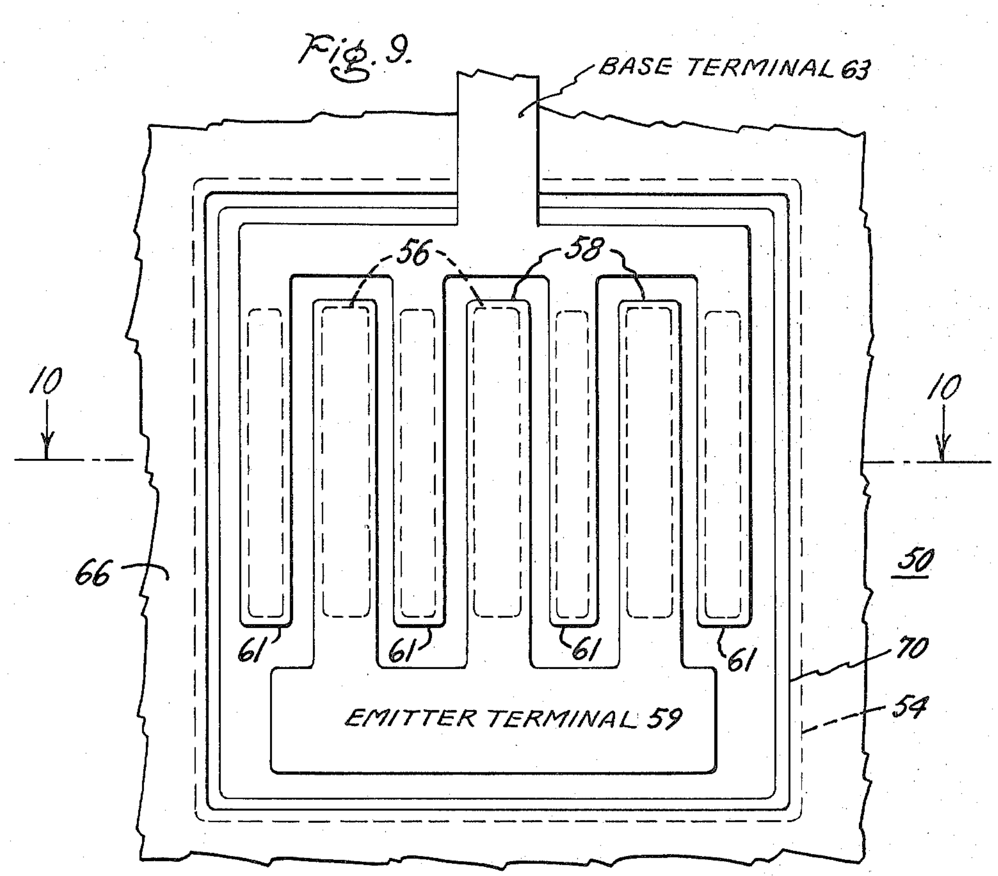
FIG. 9 is a plan view of another embodiment of a semiconductor device in accordance with the present invention.

Reference is now made to FIGS. 9 and 10 which show a plan view and an elevation view in section of another semi-conductor device 50 representing an embodiment of the semi-conductor device 10 of FIG. 1 in planar form. Device 50 has regions and electrodes corresponding to the regions and the electrodes of the device of FIG. 1. Device 50 includes collector electrode or substrate 51 of silicon N-type conductivity, a silicon layer 52 of N-type conductivity epitaxially grown on the substrate 51 and forming the collector region 52 of the device. The device also includes a region 53 of N-type conductivity diffused from the surface of the epitaxially grown layer to form the avalanche zone in the collector region. The zone between the avalanche zone 53 and the substrate 51 constitutes the drift zone 60. A ring or annular region 54 of P-type conductivity surrounding the collector region, in particular the avalanche zone and spaced therefrom, is formed by diffusion of P-type activators or impurities into the substrate. In operation the ring 54 assures that the electric field intensities required for operation of the device are reached in the avalanche zone 53 before breakdown field intensity values are reached in the peripheral portions of the device. A base region 55 or layer is formed in the epitaxially layer by diffusion of P-type activators therein and contacts the annular region 54 of P-type conductivity. A plurality of elongated emitter regions 56 are formed in the P-type conductivity base layer 55 by epitaxially growing silicon layers 57 of N-type conductivity over the regions and subsequently diffusing from the epitaxially grown layers 57 to form the elongated emitter regions of N-type conductivity therein. Elongated electrodes 58 of a conductor such as aluminum are secured to the N-type emitter regions and connected to a emitter terminal 59. Similarly, elongated electrodes 61 of a conductor such as aluminum are connected to elongated 62 portions of the base layer 55 aligned between and about the elongated emitter regions to form an interleaved or inter-digitated emitter base configuration. The elongated electrodes 61 are connected to a base terminal 63. The emitter regions 56 and base contact regions 62 are separated by a relatively thin layer of silicon dioxide 65 on the surface of the epitaxially grown layer 52 utilized in the formation of the device. A relatively thick layer 66 of silicon dioxide which was utilized in the formation of the device surrounds the emitter-base structure of the device. The emitter terminal 59 and connections to base terminal 63 overlay silicon dioxide formed on the epitaxial layer in the process of forming the device 50 and accordingly the emitter and base terminals are insulated from the underlying portions of the semiconductor wafer. A suitable layer of a conductor as gold doped with antimony secured to the collector electrode, i.e., substrate 51, functions as the collector terminal 67.

In the fabrication of the device of FIGS. 9 and 10 a strongly N-type conductivity wafer 51 of silicon semiconductor material about 10 mils (one mil is a thousandth of an inch) thick is obtained. A weakly N-type layer of silicon about 20 microns ($10^{-6}$ meter) thick is grown epitaxially therein. A layer of silicon dioxide 66 about 1.5 microns thick is thermally grown thereon. A large window 70 is opened in the thick layer of the silicon dioxide extending to the surface of the epitaxial layer 52 and a donor impurity such as arsenic is diffused therein to form a region 53 of moderately N-type conductivity which will constitute the avalanche zone of the device. A channel is etched into the thick oxide layer 66 to the surface of the epitaxial layer and extending completely about the region of the epitaxial layer 52 including the avalanche zone. The annular region 54 or guard ring is formed by diffusion of an acceptor activator, such as boron into the channel, to a depth of about 2 microns and thereafter silicon dioxide is thermally grown in the channel over the guard ring to a depth of about 0.5 micron. A base window is next etched into the silicon dioxide including a portion of the thick layer 66 of the oxide overlying the inner edge of the guard ring to be used in the formation of the diffused base layer 55. The base layer or region of strongly P-type conductivity is formed by diffusion of an acceptor activator, such as boron, into base window. The surface of layer in the base window is cleaned and a layer 65 of silicon dioxide is thermally grown thereon. Elongated emitter windows are etched in the silicon dioxide layer to expose the surface of the layer in and on which elongated emitter regions 56 are to be formed. Strongly N-type silicon is epitaxially deposited in layers 57 in the emitter windows and diffusion thereafter is performed to form the emitter-base P-N junctions in the base layer 55. Elongated base electrode windows are etched into the silicon dioxide layer 65 to expose the base region. The exposed portions of the base region, the epitaxially deposited emitter layers and the remaining portions of the silicon dioxide layer 65 are metallized with a continuous layer of a conductor such as aluminum. By photolithographic masking and etching the continuous conductive layer is patterned into electrodes 58 connected to an emitter terminal 63 and base electrodes 61 connected to a base terminal 63. The conductive material, if aluminum, is sintered to enable low resistance electrical connection to be made thereto. A layer of gold including an activator such as antimony is alloyed into the other opposed surface of the wafer or substrate 51 to form the collector terminal 67 of the device.

The various techniques utilized in the fabrication or formation of the device including epitaxially growing layers on silicon or silicon, thermally growing silicon dioxide on silicon, forming windows in silicon dioxide layers by photolithographic masking and etching, diffusing activators through silicon dioxide masking layers into an underlying laye to form regions of desired type geometry and electrical characteristics, metallizing of regions to form desired electrical connection paths and the like are well known to those skilled in the art. Utilizing such techniques the steps set forth above can be readily carried out.

Figure 11:
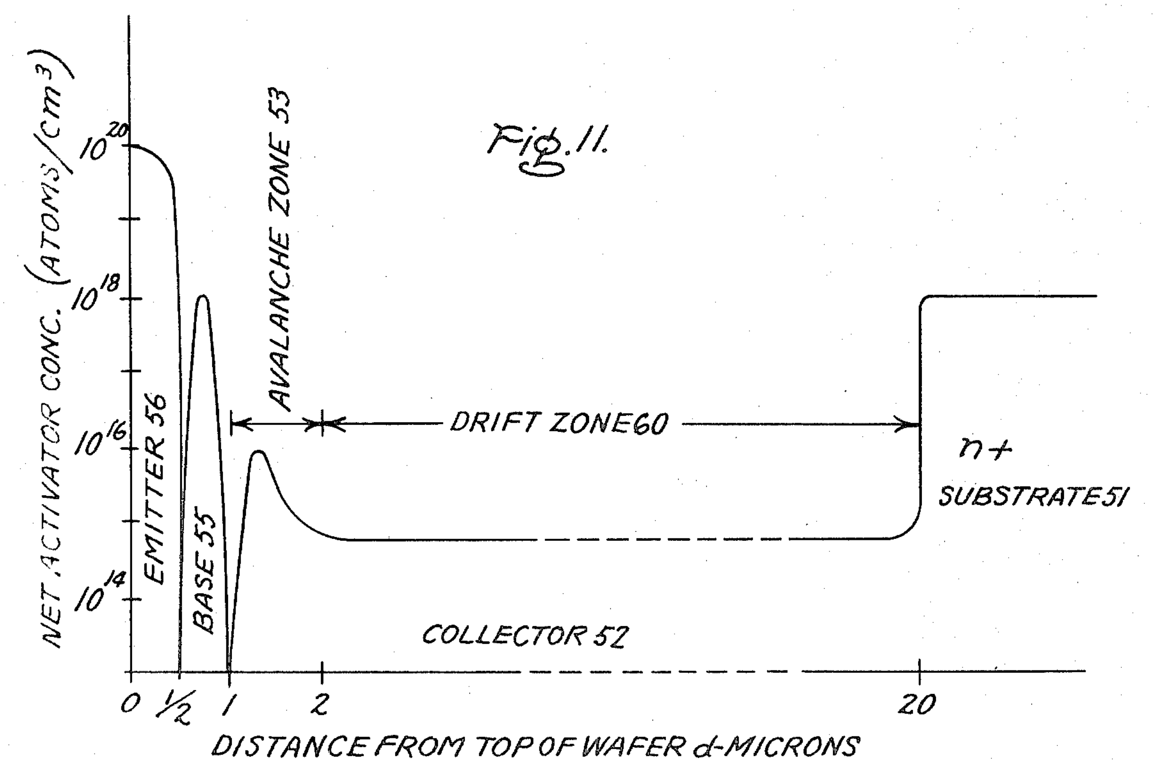
FIG. 11 shows a graph of net activator concentration in the device of FIG. 9 as a function of distance through the semiconductor wafer thereof from the top surface thereof to the collector electrode.

The device 50 of FIGS. 9 and 10 is suitable for use at various microwave frequencies depending on the particular dimensions thereof. With a structure in which the epitaxial layer is approximately 20 microns thick and the emitter base and collector regions having dimensions and a profile of net activator concentration measured in a line 75 from the emitter electrode to the collector electrode as shown in FIG. 11, the device would be suitable for operation at a frequency of about 2 gigahertz. To provide for operation at higher frequencies for example, an order of magnitude greater in frequency, the dimensions of the device and other parameters of the device would be changed in a manner well known to those skilled in the art.

Reference is now made to FIG. 11 which shows the profile of the net activation concentration of the device along a line 75 passing from the upper interface of the epitaxially grown layer downward through to the silicon substrate. The profile shows net impurity concentration to a log scale as a function of distance d.

The emitter region 56 has a depth or extent of about 0.5 micron and a peak net activator concentration of $10^{20}$ atoms per cubic centimeter. The base region 55 between emitter and collector P-N junctions has depth of 0.5 micron and a peak net activator concentration of $10^{18}$ atoms per cubic centimeter. The collector region 52 has a depth of about 19 microns from collector P-N junction to substrate 51, or collector electrode and includes the avalanche zone 53 about 2 microns wide and having a peak net activator concentration of $10^{16}$ atoms per cubic centimeter contiguous to the collector P-N junction and the drift zone 60 about 18 microns in depth and having a relatively constant net activator concentration of about $5 \times 10^{14}$ atoms per cubic cm. The high concentration of net donor activators in the emitter region in relation to the concentration of net acceptor activators in the base region provides good emitter efficiency. The high net acceptor activator concentration in the base region in relation to the net donor activator concentration in the collector region limits the spreading of depletion of majority carriers in the base region upon application of operating voltage between base and collector electrodes thereby minimizing base spreading resistance and avoiding complete depletion in the base region to the emitter P-N junction. The mode of operation of the device 50 is identical to the mode of operation of the device of FIG.

1 and the manner of connection of the device in circuit is identical to the manner of connection of the device of FIG. 1 in circuit. The provision of the annular region or guard ring 54 of strongly P-type conductivity around the avalanche zone 53 of the collector region 52 having a relatively large radius at the cylindrical interface or junction with layer 52 and providing a net donor activator concentration in the layer 52 adjacent to the interface substantially lower than in the N-type conductivity zone 53 assures that the electric field intensity desired in the avalanche zone will be reached before such field intensity value is reached in the peripheral portion 52 of the device. Conveniently, the guard ring 54 has substantially the same or lower net acceptor activator concentration as the base region.

While embodiments of the devices in accordance with the invention have been described which utilize silicon semi-conductor material, it will be readily understood that germanium semiconductor material may as well be utilized in view of the fact that the avalanche coefficient of holes in germanium is greater than the avalanche coefficient of electrons therein over a wide range of applied electric field intensities.

While the device has been shown in a common base circuit it will be readily understood that a common emitter circuit may be utilized as well. While the operation of the device of the invention has been described in a circuit operating as a class C amplifier, it will be readily understood that device may be operated in class A and class B amplification modes as well.

While the invention has been described in specific embodiments it will be appreciated that modifications, such as those described above, may be made by those skilled in the art, and it is intended by the appended claims to cover all such modifications and changes as fall within the true spirit and scope of the invention.

What we claim as new and desire to secure by letters Patent of the United States is:

1. A semiconductor device for amplifying signals in a band of frequencies comprising a body of semiconductor material including an emitter region of one conductivity type, a base region of opposite conductivitity type contiguous with said emitter region and forming an emitter P-N junction therewith, a collector region of said one conductivity type contiguous with said region of opposite conductivity type and forming a collector P-N junction therewith, said emitter and collector P-N junctions being spaced to provide transistor action therebetween, said collector region being constituted of semiconductor material in which the avalanche coefficient of majority conduction carriers therein is substantially greater than the avalanche coefficient of minority conduction carriers therein, first, second and third electrodes each connected to a respective one of said emitter, base and collector regions, said collector region having a length between said collector P-N junction and said third electrode which is substantially equal to one half the saturation drift velocity of majority carriers therein divided by the center frequency of said band of frequencies, the net activator concentration varying along the length of said collector region such that when said collector region is depleted of majority conduction carriers along the length thereof, an electric field is established in said collector region which produces a finite value of conduction carrier multiplication therein.

2. The semiconductor device of claim 1 in which said collector region includes an avalanche zone contiguous to said collector junction and the remainder thereof constitutes a drift zone.

3. The semiconductor device of claim 2 in which the length of said avalanche zone is substantially smaller than said drift zone.

4. The semiconductor device of claim 3 in which the average net concentration of activators in said avalanche zone is substantially greater than the net average concentration of activators in said drift zone.

5. The combination of claim 4 in which the integral of net activator concentration per square centimeter of cross-section over the length of said collector region is approximately equal to $2.5 \times 10^{12}$ $cm^{-2}$.

6. The semiconductor device of claim 4 in which the peak net concentration of activators in said avalanche zone is substantially greater than the net concentration of activators in said drift zone.

7. The semiconductor device of claim 3 in which said avalanche zone is a small fraction of the length of said collector region.

8. The semiconductor device of claim 3 in which the net concentration of activators in said drift zone is substantially uniform.

9. The semiconductor device of claim 1 in which said collector region is constituted of N-type conductivity silicon semiconductor material.

10. A semiconductor device for amplifying signals in a band of frequencies comprising a body of semiconductor material including a first region of one conductivity type, a second region of opposite conductivity type contiguous with said one region and forming an emitter P-N junction therewith, a third region of said one conductivity type contiguous with said region of opposite conductivity type and forming a collector P-N junction therewith, said emitter and collector P-N junctions being spaced to provide transistor action therebetween, said third region including an avalanche zone contiguous to said collector junction and the remainder thereof constituting a drift zone, said third region being constituted of semiconductor material in which the avalanche coefficient of majority conduction carriers therein is substantially greater than the avalanche coefficient of minority conduction carriers therein, first, second and third electrodes each connected to a respective one of said first, second and third regions, said third region having a length between said collector P-N junction and said third electrode which is substantially equal to one half the saturation drift velocity of majority carriers therein divided by the center frequency of said band of frequencies, the net activator concentration varying along the length of said third region such that when said third region is depleted of majority conduction carriers along the length thereof, an electric field is established in said third region which produces a finite value of conduction carrier multiplication therein, an output impedance, means for applying a bias voltage in circuit with said collector P-N junction and said output impedance to deplete said third region of majority conduction carriers and establish said electric field therein, means for applying a signal current in circuit between said first and second electrodes, to cause a corresponding charge to be injected into said avalanche zone of said third region, whereby majority conduction carriers in said avalanche zone produced by avalanche multiplication of said injected charge move under the influence of the electric field in said drift zone to said third electrode and produce current flow in said output impedance in proportional response to said signal current.

11. The combination of claim 10 in which the current multiplication is less than a value at which the proportional relationship of output current to input current in said collector region becomes lost.

12. The combination of claim 10 in which the ratio of avalanche coefficients of majority carriers to minority carriers in said avalanche zone is greater than 5.

13. The combination of claim 10 in which said emitter P-N junction is biased to permit signal current to flow over a less than a half cycle thereof.

14. The combination of claim 10 in which said output impedance is connected in shunt with said second and third electrodes.

15. The combination of claim 10 in which said output impedance includes a parallel resonant circuit.

16. The combination of claim 10 in which said bias voltage has a value which provides a charge multiplication in said third region in the range of 5 to 50.

17. A semiconductor device comprising a substrate of semiconductor material of one conductivity type, a collector layer of semiconductor material of one conductivity type having a pair of contiguous zones one of which is remote from said substrate and the other of which is contiguous with said substrate, the net impurity concentration of said one zone being substantially greater than the net impurity concentration of the other of said zones, the width of said one zone being substantially less than the width of said other zone, a base layer of semiconductor material of opposite conductivity type contiguous with said one zone of said collector layer to form a collector P-N junction therewith, an emitter layer of semiconductor material of said one type conductivity contiguous with said base layer, first, second and third electrodes each connected to a respective one of said emitter, base and collector layers, said collector layer being constituted of semiconductor material in which the avalanche coefficient of majority conduction carriers therein is substantially greater than the avalanche coefficient of minority conduction carriers therein, said collector layer having a length between said collector P-N junction and said third electrode which is substantially equal to one half the saturation drift velocity of majority carriers therein divided by the nominal frequency of operation thereof, the net activator concentration varying along the length of said collector layer such that when said collector region is depleted of majority conduction carriers along the length thereof, an electric field is established in said collector layer which produces a finite value of conduction carrier multiplication thereon.

18. The semiconductor device of claim 17 in which an annular region of opposite conductivity type is contiguous with and surrounds said base layer and extends into said collector layer, said annular region having an interface with said collector layer of relatively large minimum radius of curvature, the net impurity concentration of said collector layer in directions extending radially outward from said interface being less than the net impurity concentration of said one zone whereby upon application of an increasing voltage between the second electrode and the third electrode a value of electric field intensity in said one zone of said collector layer is always greater than the electric field intensity of said collector layer adjacent said annular layer.

* * * * *